(12) United States Patent
Schweitzer

(10) Patent No.: US 6,507,996 B1
(45) Date of Patent: Jan. 21, 2003

(54) APPARATUS FOR POSITIONING ELECTRONIC COMPONENTS

(75) Inventor: Karl Schweitzer, Angerberg (AT)

(73) Assignee: Datacon Semiconductor Equipment GmbH, Radfeld (AT)

( * ) Notice: Subject to any disclaimer, the term of this patent is extended or adjusted under 35 U.S.C. 154(b) by 0 days.

(21) Appl. No.: 09/600,891

(22) PCT Filed: Feb. 12, 1999

(86) PCT No.: PCT/AT99/00037

§ 371 (c)(1),
(2), (4) Date: Aug. 16, 2000

(87) PCT Pub. No.: WO99/43192

PCT Pub. Date: Aug. 26, 1999

(30) Foreign Application Priority Data

Feb. 17, 1998 (AT) .............................................. 279/98
Mar. 13, 1998 (AT) .............................................. 453/98

(51) Int. Cl.[7] ................................................ H05K 3/30
(52) U.S. Cl. ............................ 29/740; 29/739; 29/743; 29/DIG. 44; 29/832
(58) Field of Search ......................... 29/740, 739, 741, 29/743, DIG. 44, 832, 833, 834, 836

(56) References Cited

U.S. PATENT DOCUMENTS 4,494,902 A * 1/1985 Kuppens et al. ............... 29/740
4,980,971 A * 1/1991 Bartschat et al. .............. 29/833
5,765,277 A * 6/1998 Jin et al. ....................... 29/743

FOREIGN PATENT DOCUMENTS

DE 19610294 10/1996

OTHER PUBLICATIONS

Patent Abstracts of Japan, vol. 014, No. 225 (May 1990) & JP 02 056944A (Feb., 1990).

* cited by examiner

Primary Examiner—Rick K. Chang

(57) ABSTRACT

The invention relates to a device for positioning electronic circuits arranged on a foil (2), such as chips (1), on a circuit card (11), ceramic substrate or the like, using the flip-chip method. The chips (1) are lifted from the foil (2) by needles (4) located under said foil and are further picked up by a needle with a suction cup (3) or by a suction cup that rotates said chips (1) by 180°. The chips are then received by another needle with a suction cup (10) and positioned on the circuit card (11) for direct connection of the contact lines. The needles (4) used for lifting the chips (1) as well as the needle with the suction cup (3) for receiving said chips (1) are capable of synchronous and mainly rectilinear or vertical displacement. The needle with the suction cup (3) is placed in a us holder (5) which is mounted in an arm (6) so as to be capable of movement, wherein said arm is driven by a drive organ (9) in order to carry out the 180° rotation movement. The additional needle with the suction cup (10) is also arranged in a holder (12) that provides it with four degrees of freedom, i.e. along the axes x, y, z and rotation.

14 Claims, 5 Drawing Sheets

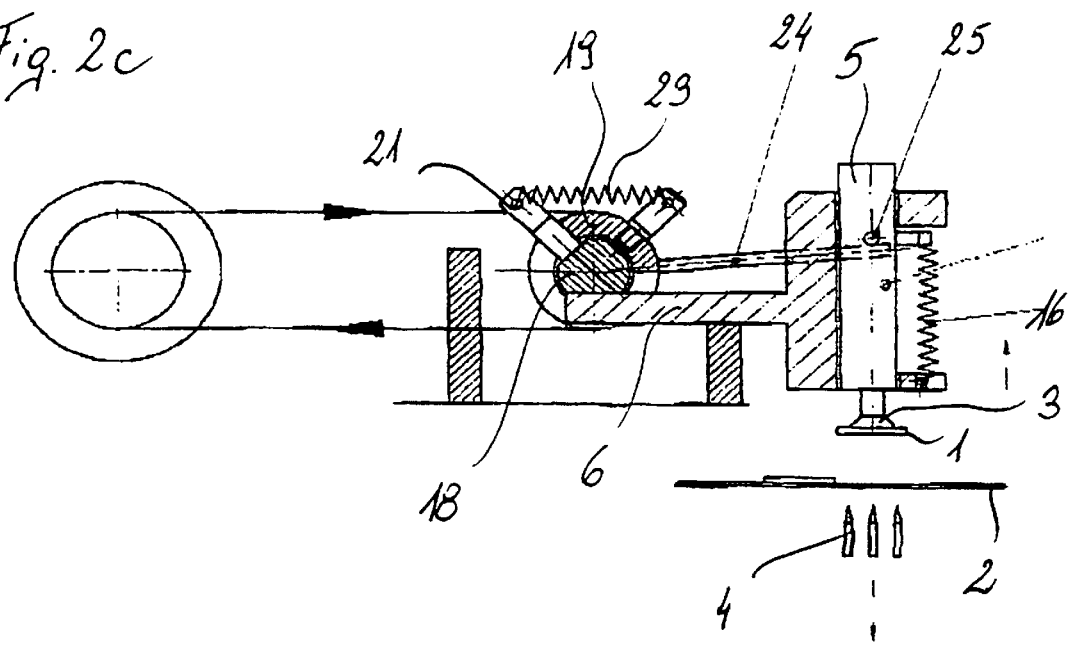
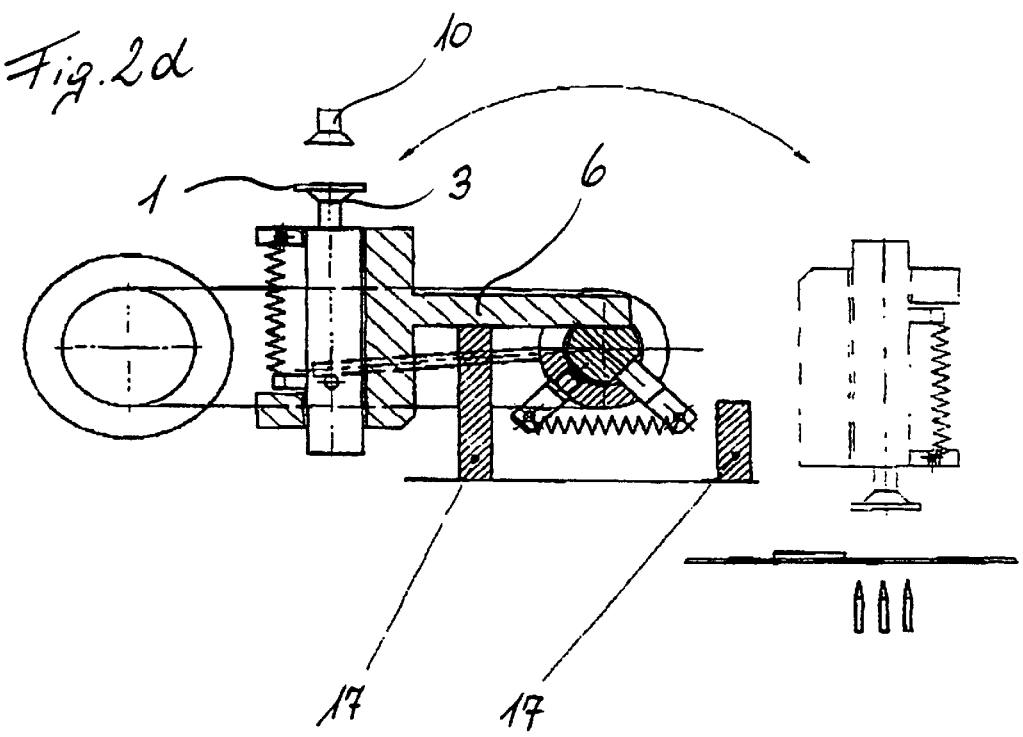

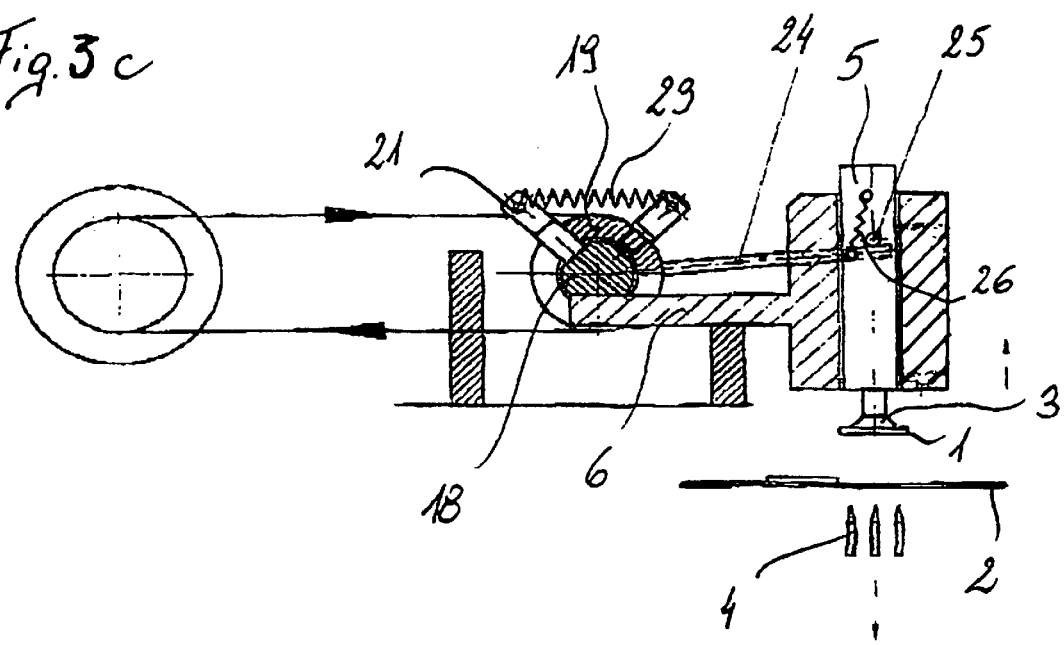
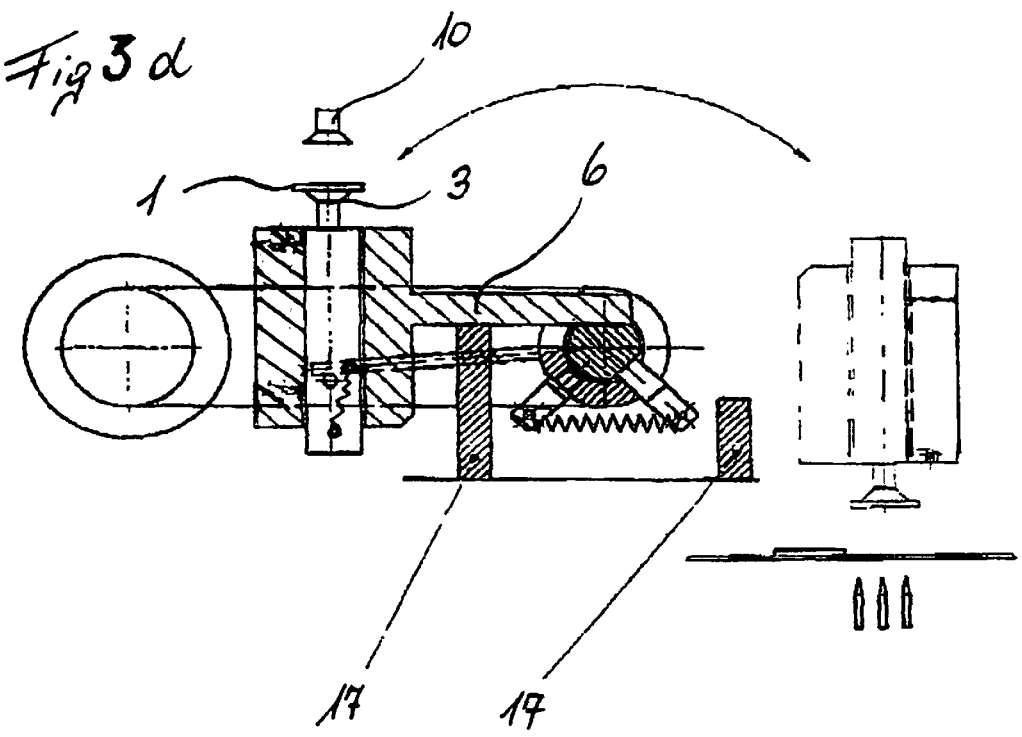

APPARATUS FOR POSITIONING ELECTRONIC COMPONENTS

BACKGROUND OF THE INTENTION

1. Field of the Invention

The invention relates to a device for positioning electronic circuits arranged on a foil, for example chips, on a circuit card, ceramic substrate or the like, using the flip-chip method, whereby the chips are lifted from the foil by needles located under the said foil, and are further picked up by a needle with a suction cup or by a suction cup that rotates the chips by 180°, and the chips are then received by another needle with a suction cup and positioned on the circuit card for direct connection of the contact lines.

2. Discussion of Background Information

Normally, the electronic circuits or the chips are fixed to the circuit card on the side facing away from the contacts, and the contacts and contact lines are connected with microwires. The wires are connected to the contacts by means of ultrasonic welding, for example. This method is also referred to as wire bonding. This method is disadvantageous because too many steps were required to manufacture the finished circuit board, and the scattering effects are difficult to control.

The flip-chip method is an alternative to the wire bonding. The contacts of the chip are connected directly to the contact lines of the circuit card. This method provides a higher contact reliability, provides shorter contact paths, especially at high frequencies, and eliminates the costly wire bonding. In order to balance the different strain coefficients, the space between the chip and the circuit card is filled with glue or filler after contacting.

With the flip-chip method, it is important that the contacts on the chip and circuit card are positioned exactly on top of each other. In order to achieve this, the position of each chip and each circuit card must be measured and a corrective movement calculated. If the circuit card geometry is precise enough, it is sufficient to measure two reference points on the circuit card, and to calculate the individual positioning points. Otherwise, each individual positioning point has to be measured individually.

A particular problem is the programming of the target position for a chip, since visual correction of the result is not possible. The structures of the chip and the circuit card are located directly on top of each other. The accuracy of the positioning of the contacts can only be verified with destructive methods.

SUMMARY OF THE INVENTION

The present invention provides a device of the type mentioned above, which avoids the disadvantages of the prior art, and offers a high degree of user comfort due to programmability and reproducibility of the various settings, and has a simple structure.

The device according to the present invention is characterised by the fact that both the lifting needles used for lifting the chip from the foil and the receiving needle with a suction cup are capable of a synchronous and substantially rectilinear or vertical movement, that the needle with a suction cup is placed in a holder that is mounted in an arm so as to be capable of movement, wherein the arm is driven by a drive in order to carry out the 180° rotation movement, and that an additional needle with a suction cup is also mounted in a holder that provides it with four degrees of freedom, namely along the axes x, y, z and rotation about one of the axes.

With the present invention, it is possible to use a motor for both the rotation of 180° and the vertical chip pick-up movement, and to control the chip pick-up in such a way that it is synchronous with the movement of the lifting needles. This synchronous pick-up means a significant quality improvement, since the chip is held between the lifting needles and the needle with a suction cup with constant force throughout the entire procedure. Moreover, there is no horizontal relative movement between the lifting needles and the needle with the suction cup, which would inevitably destroy the chip surface.

Furthermore, the present invention makes it possible to produce a mechanical device for extremely rational manufacture and for an increase in the automation of circuit card printing. In addition, the present invention makes it possible to improve enormously the quality of the circuit card thus produced. Another significant advantage is that the structure of the device according to the present invention is very simple and very economical due to the arrangement of only one drive for the movements to position the chip. The freedom of movement of the second needle with a suction cup guarantees a high quality of positioning of the chips on the circuit card.

In accordance with another aspect of the present invention, two stereometric cameras are provided, whereby one stereometric camera is used to measure the circuit card and the other stereometric camera is used to measure the at least one chip, and both stereometric cameras are connected to a computer, and the two stereometric cameras are calibrated by overlaying the image of the chip taken by one camera and the image of the circuit board taken by the other camera until they match, and this calibrated position can be stored on a computer. With the two stereometric cameras, a further increase in quality is achieved. Each circuit card or each substrate is held in position and measured at two points using a stereometric camera. Thereby, a difference from the programmed original substrate may already occur. The recorded definitive values of the circuit card are entered into the computer and stored. The second stereometric camera measures each chip, whereby these values are also entered into the computer. Of course the calibrated position, which is obtained by overlaying the two images, is also stored in the computer.

In accordance with a further aspect of the present invention, the computer calculates or detects possible deviations from the calibrated position after measuring the chip, and controls the second needle with a suction cup in accordance with this difference. With the measurement and registration of the chip data by the second stereometric camera and the corresponding evaluation using suitable software, a programming aid is provided for the positioning of the chip on the circuit card. The second needle with a suction cup is controlled in accordance with the values calculated by the computer. The main advantage is the programmability of control for the device, whereby for example the path, the speed and/or the time or the like can be programmed. Moreover, it is of great advantage that all the values or data are reproducible, especially via the computer unit. The reproducibility of settings is an imperative in such highly specialised technology, in particular in order to guarantee perfect quality.

As already mentioned, the programming of the target position of the chip is particularly difficult in the prior art, since visual correction of the result is not possible.

In order to make this process as simple as possible for the operator, the method according to the present invention has been developed, whereby it is sufficient to overlay the image of the chip structure taken by one camera and the image of the circuit card taken by the second camera until they match. Thereby, the computer automatically calculates the target position for the chip.

In a further embodiment of the present invention, a stepper motor is provided as a drive for the 180° rotation movement of the arm. The advantage is that the stepper motor is a mature drive component that requires very little maintenance and can be controlled very accurately with the smallest units of measurement.

In accordance with a further aspect of the present invention, the arm is arranged radially on a shaft, whereby this shaft is mounted in a concentric tubular shaft, and the tubular shaft has a slit for the arm to pass through, with an angle greater than 180°, preferably 191°, and the tubular shaft can be driven by the stepper motor via a drive belt. The angle being greater than 180° advantageously guarantees that a vertical movement of the needle with a suction cup is possible when picking up the chip from the foil. Moreover, with the arrangement of the arm on a shaft that is mounted in a tubular shaft, a simple and functional design is guaranteed.

In accordance with a special aspect of the present invention, both the shaft and the tubular shaft are fitted with a radial bolt, whereby the bolt in the shaft juts out through the slit or a hole in the tubular shaft and the two bolts are connected by a tension spring. The advantage of this design lies in the fact that the technically simple components guarantee reliable and low-maintenance operation.

In accordance with a further aspect of the present invention, the radial arm arranged on the shaft performs a rotation movement of exactly 180°, limited by stoppers. For the exact hand-over of the chip from the lifting needles to the needle with a suction cup, and from the needle with the suction cup to another needle with a suction cup, the accurate 180° rotation movement is an advantageous basic requirement that guarantees a trouble-free process.

In accordance with a further embodiment of the present invention, the tubular shaft has an additional radial bolt and a holder is fitted with a stopper, whereby the radial bolt sits on this stopper when the arm is in horizontal position. The advantage thereby is that with this simple construction, the rectilinear, precise vertical movement of the needle with the suction cup can be performed in a controlled manner.

In accordance with another aspect of the present invention, the holder is mounted in the arm so as to be capable of movement, against the tension of a spring. The advantage of this design is that a highly technical work process can be performed with technically simple components.

In accordance with a further aspect of the present invention, the holder is mounted in the arm so as to be capable of movement, whereby a spring is provided that is connected to the holder and the radial bolt. The advantage of this design is that a highly technical work process can be performed with technically simple components. In particular, the force acting on the chip via the needle with a suction cup can be defined precisely via the angle of the radial bolt when the arm is lying on the stopper, i.e. the angle in excess of 180°. This is of advantage since it is more or less a technological necessity to apply greater force to larger chips than to smaller chips. Moreover, the defined application of force is of advantage when different tools are used. When using a rubber tool, greater force will be applied than when using a steel tool. In addition, the force acting on the chip during the pick-up process can be kept more or less constant.

In accordance with another advantageous aspect of the present invention, the spring is a tension spring. This offers the advantage that the distance between the radial bolt and the stopper for the holder on which the radial bolt lies is virtually zero. This also means that the spring always has the same length, so that the force is constant.

In accordance with a further aspect of the present invention, the tubular shaft can be further rotated counter to the force of the tension spring. By driving the tubular shaft with the stepper motor, an accurate and precise control of the movement is possible, whereby the tension spring supports the basic striving of the invention for simplicity, reliability and economy.

BRIEF DESCRIPTION OF THE DRAWINGS

The invention is further described in detail based on the design examples illustrated in the figures. The figures are illustrated and not to scale.

FIGS. 2a to 2d illustrate the movement of the needle with a suction cup, and

FIGS. 3a to 3d illustrate the movement of the needle with a suction cup with a tension spring arrangement on the holder.

Figure 1:
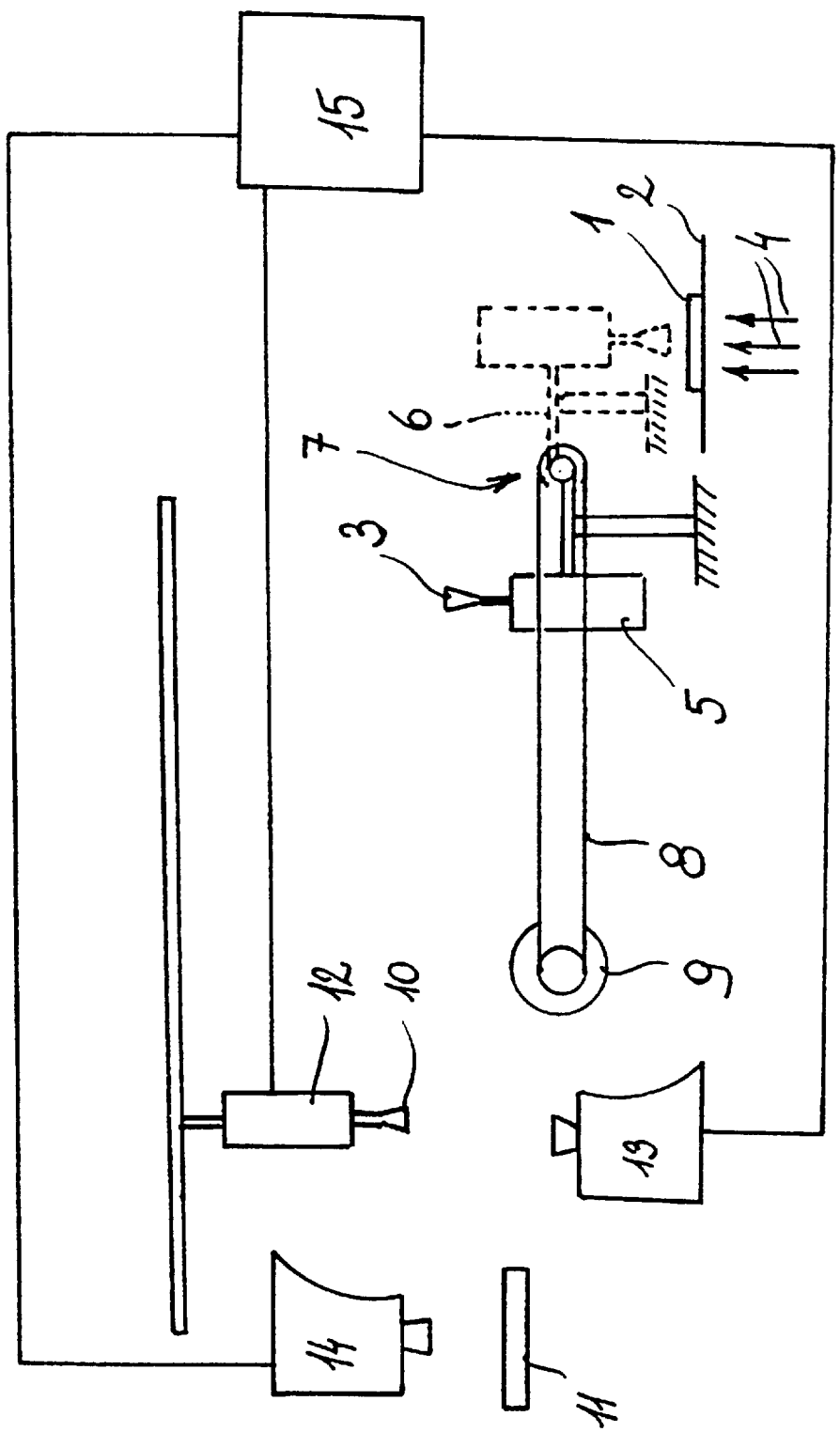
FIG. 1 shows a sketch of the device.

In accordance with FIG. 1, the device for positioning electronic circuits, generally referred to as chips 1, has a machine frame (not shown), on which the following components are arranged, either fixed or capable of movement depending on their function.

In the flip-chip method, chip 1, which is on foil 2, is arranged within reach of a needle with suction cup 3. Beneath foil 2 with chip 1, there is a device with lifting needles 4. In order to lift chip 1 from foil 2, the needles pierce through foil 2, whereby the needle with suction cup 3—indicated by the dotted line in this FIG. —lies on the opposite side of chip 1. Chip 1 is lifted by an exact, rectilinear, vertical and synchronous movement of needles 4 and the needle with suction cup 3, whereby an exact vertical movement—as described later—is performed. The needle with suction cup 3 is placed in holder 5, whereby holder 5 is mounted in arm 6. After chip 1 is picked up from foil 2 by the needle with suction cup 3, the needle with suction cup 3 is rotated by 180°, preferably along a horizontal axis. This swivel or rotation movement is controlled by rotation mechanism 7, which is connected to drive 9 by drive belt 8. Chip 1 is then picked up by another needle with suction cup 10 for positioning on a substrate, in particular ceramic substrate or circuit card 11. The needle with suction cup 10 is also arranged in holder 12, whereby holder 12 provides the needle with suction cup 10 four degrees of freedom. The four degrees of freedom are along the axes x, y, z and rotation about one of the axes. These four degrees of freedom are necessary for positioning chip 1 on circuit card 11. In addition, each needle with suction cups 3 and 10 has a vertical range of spring in holders 5 and 12, in order to be able to pick up or hand over chip 1 very gently.

Before chip 1 is positioned on circuit card 11, chip 1 is measured by a stereometric camera. Equally, circuit card 11 is measured by stereometric camera 14 first. Both stereometric cameras 13 and 14 are connected to computer 15, which stores the measured data.

The two stereometric cameras 13 and 14 are calibrated by overlaying the two images, whereby this calibrated position is stored in computer 15. By measuring chip 1 with stereometric camera 13, the computer can calculate or detect any deviations from the calibrated position. Computer 15 then controls the needle with suction cup 10 in accordance with the difference, and positions chip 1 on circuit card 11. The software 15 on the computer also serves as a programming aid.

FIGS. 2a to 2d illustrate the movement of the needle with suction cup 13 from picking up the chip until handing it over to the second needle with suction cup 10.

Figure 2A:
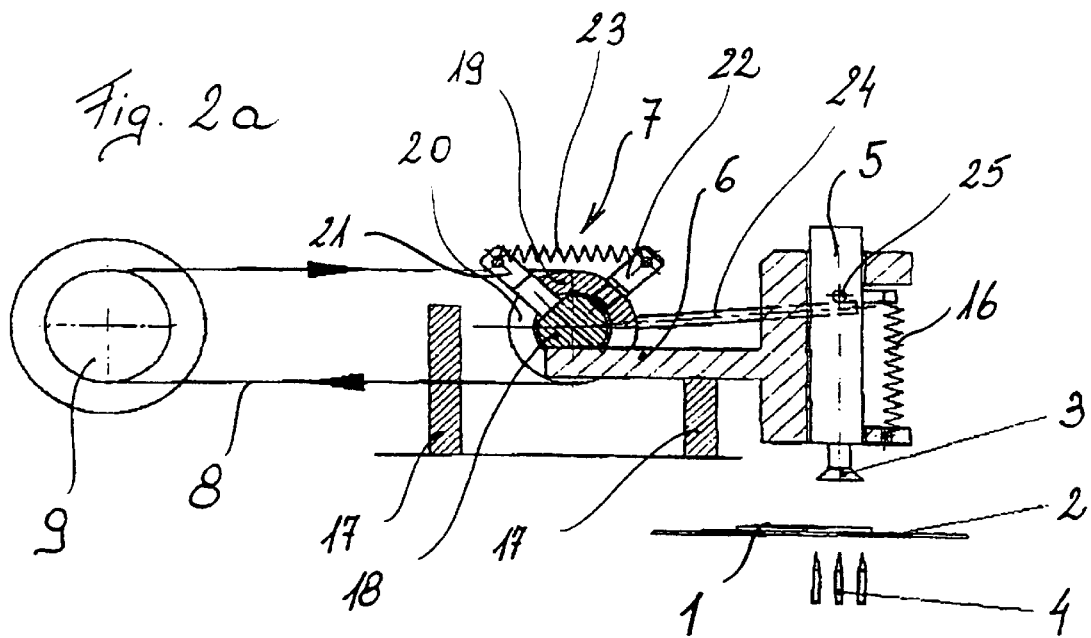

In accordance with FIG. 2a, the needle with suction cup 3 is placed in holder 5, whereby holder 5 is mounted in arm 6 so as to be capable of longitudinal movement against the pressure of spring 16. Foil 2 with chip 1 arranged thereupon is positioned within the range of the needle with suction cup 3, whereby lifting needles 4 are arranged on the side of foil 2 facing away from the needle with suction cup 3.

Ann 6 is capable of rotation of exactly 180° by means of rotation mechanism 7. In order to achieve a precise rotation of 180°, there are stoppers 17 on both sides of the axis of rotation, which limit the rotation movement of arm 6. Rotation mechanism 7 consists of shaft 18, placed in concentric tubular shaft 19. Arm 6 is mounted radially or tangetially on shaft 18, whereby tubular shaft 19 has slit 20 through which arm 6 passes. Slit 20 is dimensioned so that arm 6 can move relative to tubular shaft 19 with an angle of rotation greater than 180°. In particular, arm 6 should be able to move with an angle of 191° relative to tubular shaft 19. The rotation between 180° and 191° is transformed into vertical movement of the needle with suction cup 3. In addition, both shaft 18 and tubular shaft 19 have radial bolts 21 and 22, which are connected by tension spring 23. Bolt 21 of shaft 18 also passes through slit 20 of the tubular shaft. Naturally, tubular shaft 19 can also have a separate hole for bolt 21 to pass through. Moreover, tubular shaft 19 has radial bolt 24 that lies on stopper 25 positioned on holder 5. Rotation mechanism 7 is moved by drive belt 8, whereby drive belt 8 drives tubular shaft 19. Drive 9 for drive belt 8 is a stepper motor.

Figure 2B:
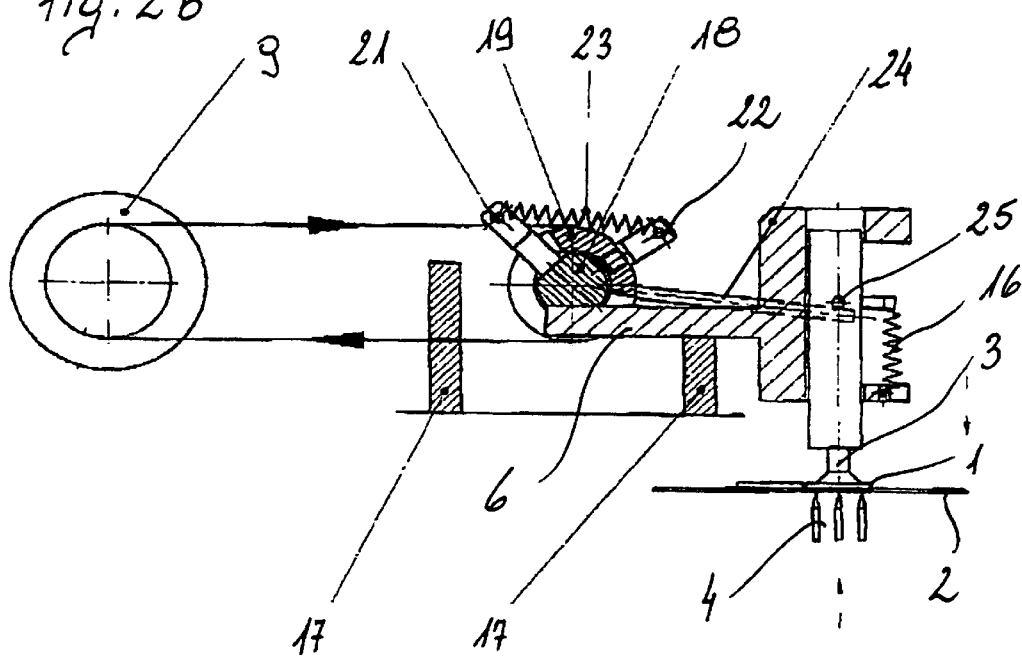

FIG. 2b illustrates the lifting of chip 1 from foil 2. As already mentioned, synchronous movement of the needle with suction cup 3 and lifting needles 4 is necessary for lifting chip 1 from foil 2, in order to maintain a constant force between lifting needles 4 and the needle with suction cup 3 during the lifting process. The precise vertical movement of lifting needles 4 is fairly easy to perform. In order to achieve a rectilinear, in this case vertical, synchronous movement of the needle with suction cup 3 to lifting needles 4, tubular shaft 19 is rotated beyond the point where arm 6 lies on stopper 17, thereby moving radial bolt 24 in the direction of the foil 2. At the same time, tension spring 23 between bolts 21, and 22 is stretched. Holder 5 with stopper 25 lying on radial bolt 24 is moved by contraction of spring 16 towards foil 2 and chip 1, where the suction of the needle with suction cap 3 takes effect. Lifting needles 4 penetrate foil 2 and press against chip 1. The direction of rotation of drive 9 is reversed easily by the arrangement of a stepper motor.

In accordance with FIG. 2c, tubular shaft 19 with radial bolt 24 is rotated counter-clockwise until the slit limit lies on bolt 21 of shaft 18. Tension spring 23 is stretched and radial bolt 24 moves holder 5 up against the force of spring 16 in a rectilinear manner. Synchronously, lifting needles 4 perform a rectilinear movement until chip 1 is lifted off foil 2. When chip 1 is picked up by the needle with suction cup 3, the 180° rotation movement of arm 6 is performed and lifting needles 4 are lowered. At this point, lifting needles 4 must not be in contact with the back of the chip any more, since chip 1 makes a 180° rotation movement around the centre-point of the axis of rotation, i.e. it does not move vertically. Otherwise, lifting needles 4 would damage the back of chip 1.

In accordance with FIG. 2d, arm 6 lies on second stopper 17, and chip 1 can be picked up by the second needle with suction cup 10. The needle with suction cup 10 moves the chip into place for measurement by stereometric camera 13, then positions it on the circuit board in accordance with the computerised control data.

FIGS. 3a to 3d illustrate the movement of the needle with suction cup 13 from picking up the chip until handing it over to the second needle with suction cup 10.

Figure 3A:
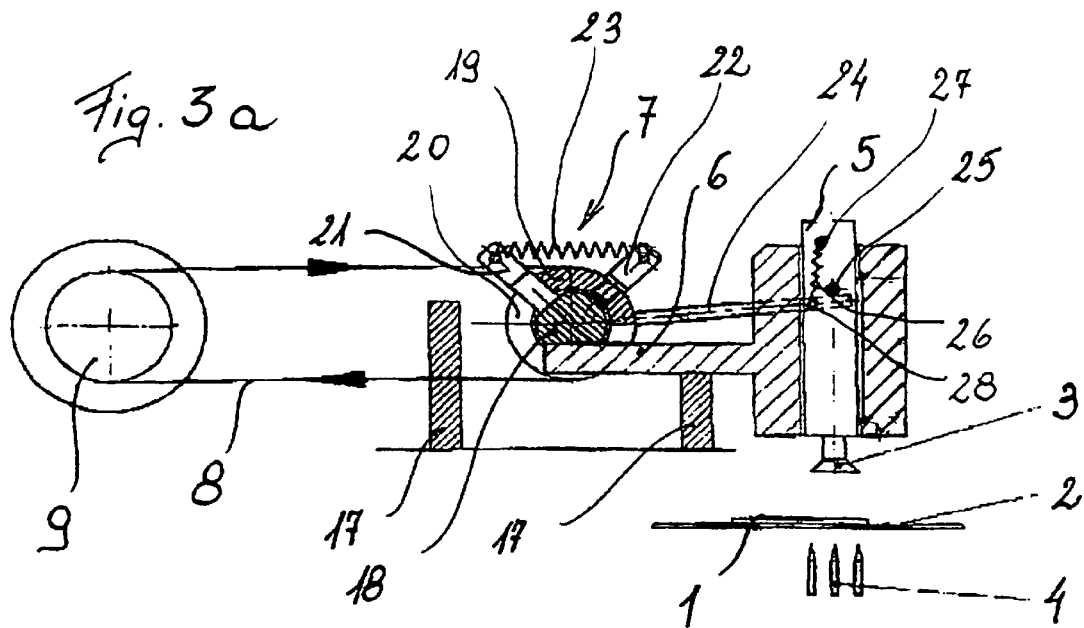

In accordance with FIG. 3a the needle with suction cup 3 is placed in holder 5, whereby holder 5 is mounted in arm 6 so as to be capable of longitudinal movement. Foil 2 with chips 1 arranged upon it is positioned within the range of the needle with suction cup 3, whereby lifting needles 4 are arranged on the side of foil 2 facing away from the needle with suction cup 3.

Arm 6 is capable of rotation of exactly 180° by means of rotation mechanism 7. In order to achieve a precise rotation of 180°, there are stoppers 17 on both sides of the axis of rotation, which limit the rotation movement of arm 6. Rotation mechanism 7 consists of shaft 18, placed in concentric tubular shaft 19. Arm 6 is mounted radially or tangetially on shaft 18, whereby tubular shaft 19 has slit 20 through which arm 6 passes. Slit 20 is dimensioned so that arm 6 can move relative to tubular shaft 19 with an angle of rotation greater than 180°. In particular, arm 6 should be able to move with an angle of 191° relative to the tubular shaft. The rotation between 180° and 191° is transformed into vertical movement of the needle with suction cup 3. In addition, both shaft 18 and tubular shaft 19 have radial bolts 21 and 22, which are connected by tension spring 23. Bolt 21 of shaft 18 also passes through slit 20 of the tubular shaft. Naturally, tubular shaft 19 can also have a separate hole for bolt 21 to pass through. Moreover tubular shaft 19 has radial bolt 24 that lies on stopper 25 positioned on holder 5. Rotation mechanism 7 is moved by drive belt 8, whereby drive belt 8 drives tubular shaft 19. Drive 9 for drive belt 8 is a stepper motor.

The longitudinal displacement of holder 5 in arm 6 is determined indirectly by radial bolt 24. Spring 26, in particular a tension spring, is provided which is connected to connection point 27 on radial bolt 24 and to connection point 28 on holder 5.

Figure 3B:
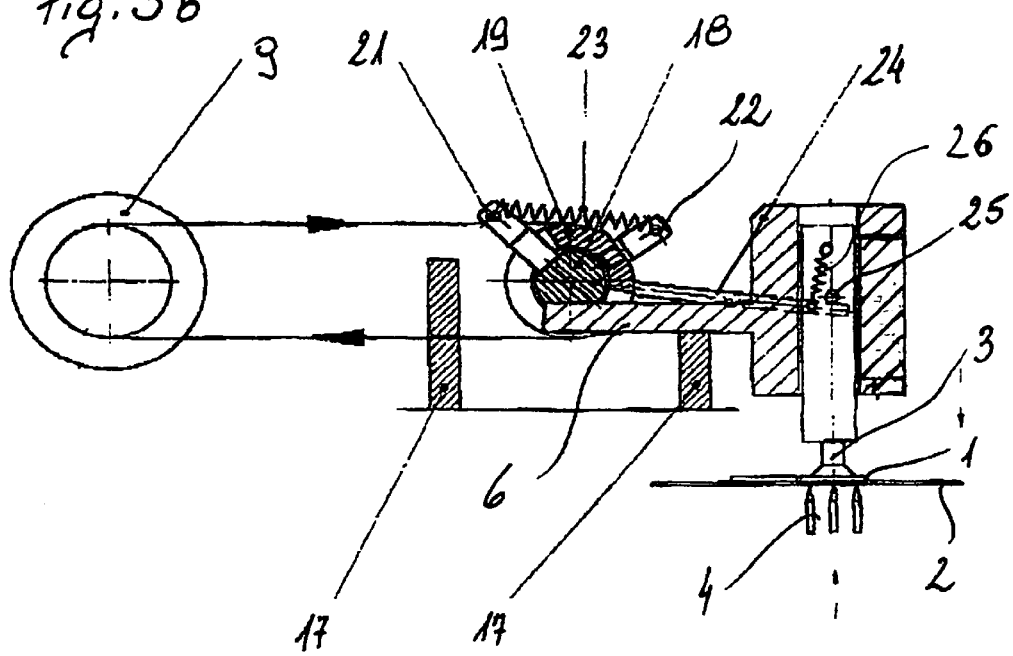

FIG. 3b illustrates the lifting of chip 1 from foil 2. As already mentioned, synchronous movement of the needle with suction cup 3 and lifting needles 4 is necessary for lifting chip 1 from foil 2, in order to maintain a constant force between lifting needles 4 and the needle with suction cup 3 during the lifting process. The precise vertical movement of lifting needles 4 is fairly easy to perform. In order to achieve a rectilinear, in this case vertical, synchronous movement of the needle with suction cup 3 to lifting needles 4, tubular shaft 19 is rotated beyond the point where arm 6 lies on stopper 17, thereby moving radial bolt 24 in the direction of foil 2. At the same time, tension spring 23 between bolts 21 and 22 is stretched. Holder 5 with stopper 25 lying on radial bolt 24 is moved by force of spring 26 towards foil 2 and chip 1, where the suction of the needle with suction cap 3 takes effect. Lifting needles 4 penetrate foil 2 and press against chip 1. The direction of rotation of drive 9 is reversed easily by the arrangement of a stepper motor.

In accordance with FIG. 3c, tubular shaft 19 with radial bolt 24 is rotated counter-clockwise until the slit limit lies on bolt 21 of shaft 18. Tension spring 23 is released and radial bolt 24 moves holder 5 up in a rectilinear manner, whereby stopper 25 always lies on radial bolt 24 due to the force of spring 26. Synchronously, lifting needles 4 perform a rectilinear movement until chip 1 is lifted off the foil 2. When chip 1 is picked up by the needle with suction cup 3, the 180° rotation movement of arm 6 is performed and lifting needles 4 are lowered. At this point, lifting needles 4 must not be in contact with the back of the chip any more, since chip 1 makes a 180° rotation movement around the centre-point of the axis of rotation, i.e. it does not move vertically. Otherwise, lifting needles 4 would damage the back of chip 1.

In accordance with FIG. 3d, arm 6 lies on second stopper 17, and chip 1 can be picked up by the second needle with suction cup 10. The needle with suction cup 10 moves the chip into place for measurement by stereometric camera 13, then positions it on the circuit card in accordance with the computerised control data.

In conclusion, it is noted that in the various described embodiments the same parts are allocated the same reference numbers and the same component names, whereby the disclosures contained throughout the description can be applied by analogy to the same parts with the same reference numbers or same component names. Furthermore, position details given in the description, e.g. top, bottom, side, etc., relate to the figure being described and illustrated at the time and with a change of position should be transferred accordingly to the new position. Moreover, individual features or combinations of features from the different embodiments illustrated and described can represent independent inventive solutions or solutions according to the invention in themselves.

What is claimed is:

1. An apparatus for positioning at least one chip from a first substrate to a second substrate, wherein the first substrate comprises a foil having a first side carving the at least one chip, the at least one chip having an electronic circuit and the second substrate comprises a circuit card or a ceramic substrate, the apparatus comprising:

lifting needles located on a second side of the foil opposite the first side of the foil carrying the at least one chip and capable of lifting the at least one chip from the foil, a first needle with a suction cup located on the first side of the foil facing away from the lifting needles and capable of picking up the at least one chip from the foil, the lifting needles and the first needle with the suction cup being capable of performing a synchronous, substantially rectilinear or vertical movement or combinations thereof, a first holder for carrying the first needle with the suction cup, an arm for mounting the first holder and capable of a 180° movement, a drive for rotating the arm in the 180° movement, said drive comprising a stepper motor, a second needle with a suction cup capable of receiving the at least one chip, a second holder for carrying the second needle with the suction cup and being movable along x, y and z axes and rotatable about one of the axes, a first shaft, a tubular shaft having an opening, the arm being arranged radially on the first shaft, passing through the opening of the tubular shaft, and being capable of rotating through an angle greater than 180°, a drive belt operably connected to the first shaft and driven by the stepper motor, two radial bolts, one of the radial bolts being positioned on the first shaft and passing through the opening of the tubular shaft and the other of the radial bolts being positioned on the tubular shaft, and a first tension spring connecting the two radial bolts, wherein the drive rotates the arm such that the first needle with the suction cup carrying the at least one chip transfers the at least one chip to the second needle with the suction cup and the second needle with the suction cup positions the at least one chip with respect to the circuit card or the ceramic substrate so as to connect the at least one chip to contact lines of the circuit card or the ceramic substrate.

2. The apparatus of claim 1 further comprising:
a first stereometric camera for measuring the circuit card or the ceramic substrate and forming a first image,
a second stereometric camera for measuring the at least one chip and forming a second image, and
a computer, the first stereometric camera and the second stereometric camera being connected to the computer, wherein the computer calibrates the first stereometric camera and the second stereometric camera by overlaying the first image and the second image until the first image and the second image match thereby forming a calibrated position and wherein the computer stores the calibrated position.

3. The apparatus of claim 2, wherein the computer after the at least one storing the calibrated position calculates or detects any deviation from the calibrated position and controls the second needle with the suction cup in accordance with the deviation.

4. The apparatus of claim 1 further comprising:
two stoppers positioned such that the arm arranged radially on the first shaft is capable of performing a 180° rotation movement limited by the stoppers.

5. The apparatus of claim 4 further comprising:
a further radial bolt, mounted on the tubular shaft and extending to the first holder for carrying the first needle with the suction cup, and
a further stopper mounted on the first holder, the further radial bolt lying against the further stopper when the arm is in a horizontal position.

6. The apparatus of claim 5 further comprising:
a second spring attached to the arm such that the first holder is capable of movement against a force of the second spring.

7. The apparatus of claim 6 wherein the first holder is positioned in the arm and
the second spring is connected to the first holder and to the further radial bolt.

8. The apparatus of claim 6 wherein the second spring is a tension spring.

9. The apparatus of claim 8 wherein the tubular s is rotatable against a force of the first tension spring.

10. An apparatus for positioning at least one chip from a first substrate to a second substrate, wherein the first substrate comprises a foil having a first side car the at least one chip, the at least one chip having an electronic circuit and the second substrate comprises a circuit card or a ceramic substrate, the apparatus comprising:

lifting needles located on a second side of the foil opposite the first side of the foil carrying the at least one chip and capable of lifting the at least one chip from the foil, a first needle with a suction cup located on a first side of the foil facing away from the lifting needles and capable of picking up the at least one chip from the foil, the lifting needles and the first needle with the suction cup being capable of performing a synchronous, substantially rectilinear or vertical movement, a first holder for carrying the first needle with the suction cup, an arm for mounting the first holder and capable of a 180° movement, a drive for rotating the arm in the 180° movement, said drive comprising a stepper motor, a second needle with a suction cup capable of receiving the at least one chip, a second holder for carrying the second needle with the suction cup and being movable along x, y and z axes and rotatable about one of the axes, a first shaft, a tubular shaft having an opening, the arm being arranged radially on the first shaft, passing through the opening of the tubular shaft, and being capable of rotating through an angle greater than 180°, a drive belt operably connected to the first shaft and driven by the stepper motor, two radial bolts, one of the radial bolts being positioned on the first shaft and passing through the opening of the tubular shaft and the other of the radial bolts being positioned on the tubular shaft, a first tension spring connecting the two radial bolts, two stoppers positioned such that the arm being arranged radially on the first shaft is capable of performing the 180° rotation movement limited by the stoppers, wherein the drive rotates the arm such that the first needle with the suction cup carrying the at least one chip transfers the at least one chip to the second needle with the suction cup and the second needle with the suction cup positions the at least one chip with respect to the circuit card or the ceramic substrate so as to connect contact wires with the circuit card or the ceramic substrate, a first stereometric camera for measuring the circuit card or the ceramic substrate and forming a first image, a second stereometric camera for measuring the at least one chip and forming a second image, and a computer, the first stereometric camera and the second stereometric camera being connected to the computer, wherein the computer calibrates the first stereometric camera and the second stereometric camera by overlaying the first image and the second image until the first image and the second image match thereby forming a calibrated position and wherein the computer stores the calibrated position.

11. The apparatus of claim 10, wherein the computer after storing the calibrated position calculates or detects any deviation from the calibrated position and controls the second needle with the suction cup in accordance with the deviation.

12. The apparatus of claim 10 further comprising:

a further radial bolt, mounted on the tubular shaft and extending to the first holder for carrying the fist needle with the suction cup, a further stopper mounted on the first holder, the firer radial bolt lying against the further stopper when the arm is in a horizontal position, and a second spring attached to the arm such that the first holder is capable of movement against the force of the spring.

13. The apparatus of claim 12 wherein the first holder is positioned in the arm and the second spring is connected to the first holder and to the further radial bolt.

14. The apparatus of claim 13 wherein the spring is a tension spring and the tabular shaft is rotatable against a force of the first tension spring.

* * * * *